(12) United States Patent
Zhu et al.

(10) Patent No.: US 7,281,224 B2
(45) Date of Patent: Oct. 9, 2007

(54) WIDE GEOMETRY RECOGNITION BY USING CIRCLE-TANGENT VARIABLE SPACING MODEL

(75) Inventors: Jun Zhu, Sunnyvale, CA (US); Yulan Wang, Fremont, CA (US); Charles Samuel McFalls, Jr., Graham, NC (US)

(73) Assignee: Synopsys, Inc., Mountain View, CA (US)

( * ) Notice: Subject to any disclaimer, the term of this patent is extended or adjusted under 35 U.S.C. 154(b) by 308 days.

(21) Appl. No.: 10/974,104

(22) Filed: Oct. 26, 2004

(65) Prior Publication Data

US 2006/0090148 A1    Apr. 27, 2006

(51) Int. Cl.
*G06F 17/50* (2006.01)
(52) U.S. Cl. .................. 716/5; 716/4; 716/6
(58) Field of Classification Search ............. 716/4–6
See application file for complete search history.

(56) References Cited

U.S. PATENT DOCUMENTS 5,701,403 A * 12/1997 Watanabe et al. .......... 345/419
6,247,853 B1 * 6/2001 Papadopoulou et al. ....... 716/4
2002/0032552 A1 * 3/2002 Nishiyama et al. ........... 703/6
2003/0126582 A1 * 7/2003 Kobayashi et al. ........... 716/21
2005/0172247 A1 * 8/2005 Papadopoulou et al. ....... 716/5

* cited by examiner

*Primary Examiner*—Thuan Do
*Assistant Examiner*—Naum Levin
(74) *Attorney, Agent, or Firm*—Bever, Hoffman & Harms, LLP; Jeanette S. Harms

(57) ABSTRACT

Wide geometry can be accurately extracted from the physical layout of an integrated circuit through the use of detection circles having diameters equal to a threshold width. Projection regions in the layout are selected, and for each projection region, a detection circle of a threshold width (diameter) is defined. A trim region within each projection region is defined using the associated detection circle, such that a portion of the trim region boundary exhibits tangency to the detection circle. The trim regions, which represent non-wide portions of the layout, are then removed to generate a wide element layout. Because the detection circle is a rotation-independent geometry, the over-extraction and under-extraction problems associated with conventional wide element extraction methods can be eliminated.

21 Claims, 13 Drawing Sheets

WIDE GEOMETRY RECOGNITION BY USING CIRCLE-TANGENT VARIABLE SPACING MODEL

BACKGROUND OF THE INVENTION

1. Field of the Invention

The invention relates to electronic design automation, and in particular to a system and method for accurately extracting wide elements from a physical layout.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer). The models define performance parameters for the cells; e.g., parameters related to the operational behavior of the cells, such as power consumption, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the component steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS(R) family of products.

As indicated in FIG. 1, physical verification of a design (step E126, indicated by the bolded chevron) is performed towards the end of the EDA software design process. A critical aspect of physical verification for modern circuits is the extraction of "wide" elements from the physical layout. Wide elements are those elements that exceed a certain threshold width(s), and therefore require different handling by layout tools. For example, wide metal elements such as interconnects often require increased spacing form adjacent elements to ensure proper formation during subsequent lithographic operations. Other reasons for special handling of wide metal elements can include mechanical stress (requiring slotting of wide metal elements) and scaling effects (resulting from different sets of design rules for different critical dimensions).

Various methods are currently employed to extract wide element information from the polygons in a physical layout. For example, FIG. 2 shows a conventional wide metal extraction method based on the detection of edges that exceed a threshold width W. In FIG. 2, an E-shaped polygon 210 is depicted that includes edges 211-218. Edges 211, 212, and 213 are all greater than threshold width W, and are therefore flagged as being "wide". However, edges 214-218 all have a length B that is less than threshold width W, and are therefore not flagged as being wide, even though those edges represent portions of element 210 that are, in fact, wide (e.g., the width of element 210 between edges 212 and 217 is greater than threshold width W). Thus, conventional edge extraction techniques such as depicted in FIG. 2 are inappropriate for the more complex polygon shapes common in modern circuit designs.

FIG. 3A shows another conventional wide metal extraction technique in which a detection square 300 is used to identify wide elements in a physical layout 390. Physical layout 390 includes sample polygons 310 and 320. To perform the "square containment" technique, detection square 300 is defined to have edges equal to the threshold width W. Any portions of a layout polygon that can fully contain detection square 300 are then flagged as wide regions. For example, detection square 300 can never fit completely within sample polygon 310. Therefore, polygon 310 would not be flagged as a wide element. On the other hand, the interior region of sample polygon 320 can be fully mapped by detection squares 300. Therefore, the entirety of polygon 320 is flagged as a wide element.

However, because the coverage area of a detection square (e.g., detection square 300) is dependent on the rotational orientation of the detection square, the square containment method can have problems with non-rectangular polygons and polygons not aligned with any of the detection square orientations. For example, FIG. 3B shows a sample polygon 330 having an octagonal shape. Two detection squares 300A and 330B are used to perform a square containment operation on polygon 330. Detection squares 300A and 300B are rotated 45° relative to one another, and each only fits within polygon 330 at a single location. Consequently, regions 330A-33H (shaded) of polygon 330 are not flagged as being wide, resulting in a star-shaped "wide element" (unshaded area) that does not properly represent the full extent of wide polygon 330. Thus, the conventional square containment method also exhibits problematic under-extraction of wide elements.

FIG. 4A shows another conventional wide metal extraction technique in which a polygon is downsized and then upsized to reduce or eliminate small features in the original polygon that could interfere with proper wide area extraction. For example, in FIG. 4A, an E-shaped original polygon 410 is downsized into an intermediate polygon 420. Note that this downsizing operation causes the "legs" of polygon 410 to disappear, so that a subsequent upsizing operation results in a final polygon 430 that exhibits a simple rectangular outline that more accurately captures the extent of the wide regions of original polygon 410.

However, in many cases, the downsizing/upsizing technique can remove important topological information from the original polygon. For example, in FIG. 4B, an octagonal original polygon 440 is downsized into an intermediate polygon 450, resulting in the removal of the "cut corners" of original polygon 440. Therefore, intermediate polygon 450 is upsized back into a final polygon 460 that exhibits a rectangular outline that extends out (in the corner regions) beyond the original outline of original polygon 440. This additional area of polygon 460 can result in problematic over-extraction of wide element information that can in turn impose unnecessary layout modification in adjacent elements.

FIG. 5A shows another conventional wide metal extraction technique in which projected edges are used to trim away non-wide regions of a polygon. For example, FIG. 5A shows a polygon 500 that includes edges E501-E504. Edges E501 and E502 form an acute angle A5 (edges forming obtuse angles are generally considered to represent wide regions by definition). Therefore, a projected edge P501 having length equal to a threshold width W can be created between edge E501 and E502 by constructing an edge perpendicular to edge E501 that hits edge E502. In a similar manner, a projected edge P502 having length equal to threshold width W can be created between edge E502 and E501 by constructing an edge perpendicular to edge E502 that hits edge E501. A region R51 (shaded) defined by the intersection of edges E501 and E502 and projected edges P501 and P502, which represents a non-wide portion of polygon 500, can then be trimmed from polygon 500. This edge projection and subsequent trimming operation can then be iteratively repeated until, in theory, all the non-wide portions of polygon 500 are trimmed away.

Unfortunately, this projected edge technique can result in under-extraction of wide regions due to what is sometimes referred to as "avalanching". Avalanching takes place when new edges formed by the trimming operation (to remove non-wide regions) can themselves generate new projected edges that trim away more and more of the polygon, until little or none of the original polygon remains. For example, FIG. 5B shows a modified polygon 500' that includes edges E501', E502', E503, E504, E505, and E506, with edges E505 and E506 having been generated by the edge projection/trimming operation applied to polygon 500 in FIG. 5A. Performing the same edge projection/trimming operation on modified polygon 500' would result in the subsequent trimming of regions R52, R53, and R54, thereby resulting in none of original polygon 500 being identified as being wide.

Accordingly, it is desirable to provide a system and method for wide element extraction from a physical layout that avoids the problematic over-extraction and under-extraction effects demonstrated by conventional methods.

SUMMARY OF THE INVENTION

Wide elements from a physical layout must be extracted efficiently and accurately to ensure proper handling of such wide elements by EDA tools. To eliminate the over-extraction and under-extraction problems associated with conventional extraction methods, a circle-tangent trim region method can be employed. An embodiment of a method for extracting wide elements from a physical layout can involve selecting a projection region between a first edge and a second edge from the physical layout, generating a detection circle having a diameter equal to a threshold width, defining a trim region in the projection region that exhibits tangency with the detection circle, and removing the trim region from the layout. The trim region can be defined by a portion of the perimeter of the detection circle and by the portions of the first and second edges that bound the non-wide region of the projection region. In one embodiment, the trim region boundary is partially formed by a portion of the detection circle. In other embodiments, projection edges tangent to the detection circle can be generated between the first and second edges to define the trim region. In some embodiments, portions of the trim region boundary can be tangent to the detection circle. In other embodiments, lines collinear with edges of the trim region can be tangent to the detection circle.

In another embodiment, a system for extracting a wide element layout from a physical layout can include logic for selecting a projection region defined by a pair of edges in the physical layout, logic for generating a detection circle of a threshold diameter, and logic for generating and removing a non-wide trim region from the projection region, the trim region boundary exhibiting tangency with the detection circle. In one embodiment, the trim region can be bounded by the detection circle and the portions of the pair of edges converging away from the detection circle. In another embodiment, the logic for trimming can include logic for generating projected edges tangent to the detection circle between the pair of edges, and logic for trimming the non-wide region based on the regions defined by the projected edges. In another embodiment, the circle generation logic can include logic for positioning the detection circle tangent to an edge adjacent to one of the pair of edges (or edges adjacent to both of the pair of edges). In another embodiment, the circle generation logic can include logic for positioning the detection circle tangent to a projected edge (or edges) extending into the projection region from an edge adjacent to one of the pair of edges (or edges adjacent to both of the pair of edges).

In another embodiment, a method for extracting wide elements from a physical layout can involve selecting a first edge and a second edge forming an acute angle from the physical layout, constructing first and second projected edges of equal length between the first and second edges, and trimming away a portion of the non-wide region defined by the first and second edges and the first and second projected edges. By properly defining the length assigned to the first and second projected edges as a function of the threshold width and the angle between the first and second edges, the effect of a circle-tangent trimming methodology can be achieved without explicitly creating the detection circle.

The invention will be more fully understood in view of the following description and drawings.

DETAILED DESCRIPTION

Wide elements from a physical layout must be extracted efficiently and accurately to ensure proper handling of such wide elements by EDA tools. To eliminate the over-extraction and under-extraction problems associated with conventional extraction methods, a circle-tangent trimming method can be employed. An embodiment of a circle-tangent trimming method is depicted in FIGS. 6A-6F.

Figure 6A:
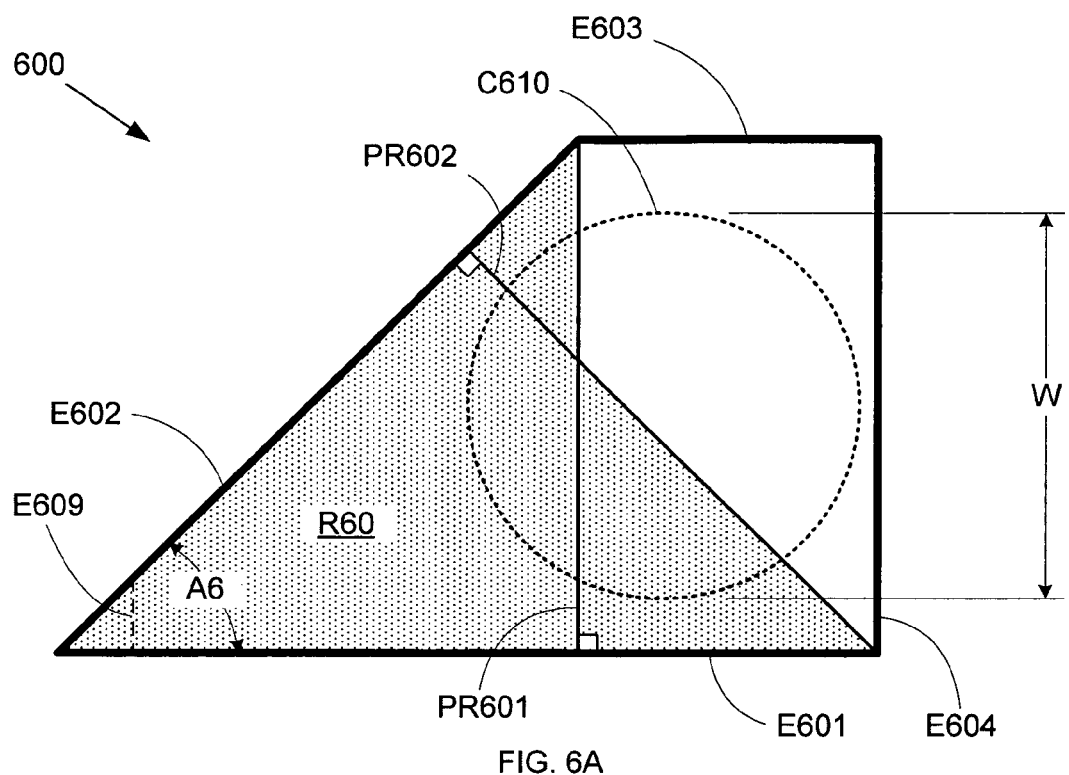
FIGS. 6A-6F are diagrams of a wide element extraction technique based on a circle-tangent trim region methodology.

FIG. 6A shows an exemplary polygon 600 formed by edges E601, E602, E603, and E604, with edges E601 and E602 forming an acute angle A6. A projection region R60 between edges E601 and E602 is defined, based on the normal projection of edge E601 onto edge E602 (i.e., the area formed by projecting normal (perpendicular) lines from edge E601 to edge E602), and the normal projection of edge E602 onto edge E601. Note that a projection region can only be generated between edges forming non-obtuse angles (i.e., either acute or parallel edges).

A detection circle C610 is defined having a diameter equal to a threshold width W. Threshold width W is a predetermined maximum width for non-wide elements, i.e., wide elements are defined as having widths greater than threshold width W. Detection circle C610 is used to define a trim region (described in greater detail below) of projection region R60 that represents non-wide portions of polygon 600 that can be removed from the physical layout.

To begin the circle-tangent trimming operation, detection circle C610 is positioned tangent to edges E601 and E602. The two points of tangency (point P61 on edge E601 and point P62 on edge E602) and threshold width (diameter) W fully define the position of detection circle C610. In turn, the converging portions of edges E601 and E602 (i.e., the portions of edges E601 and E602 extending from points P61 and P62, respectively, that converge away from detection circle C610) and the perimeter of detection circle C610 define a "non-wide" region R61 (shaded for clarity) of polygon 600.

Note that for exemplary purposes, edges E601 and E602 are depicted as intersecting edges (i.e., edges that meet each other). However, so long as edges E601 and E602 form an acute angle relative to one another, the same circle-tangent detection technique could be applied, regardless of the number of contiguous edges coupling edges E601 and E602 in non-wide region R61 (i.e., forming the boundary of non-wide region R61). For example, edges E601 and E602 could be connected by an edge E609 (indicated by the dashed line), and the circle-tangent detection operation would remain the same.

Once non-wide region R61 is defined, wide geometry extraction can be performed by defining a trim region to be removed from polygon 600. In one embodiment, the entirety of region R61 can be removed (i.e., region R61 can be defined as the trim region). However, the total removal of region R61 could lead to difficulties in subsequent EDA processing, as current EDA tools are generally configured to work with straight-edged polygons. Therefore, according to various other embodiments, the trim region can be defined by creating projected edges tangent to detection circle C610 between edges E601 and E602, as shown in FIG. 6C. In FIG. 6C, a projected edge P601 from edge E601 to edge E602 is created perpendicular to edge E601 and tangent to detection circle C610. Similarly, a projected edge P602 from edge E602 to edge E601 is created perpendicular to edge E602 and tangent to detection circle C610.

Figure 5A:
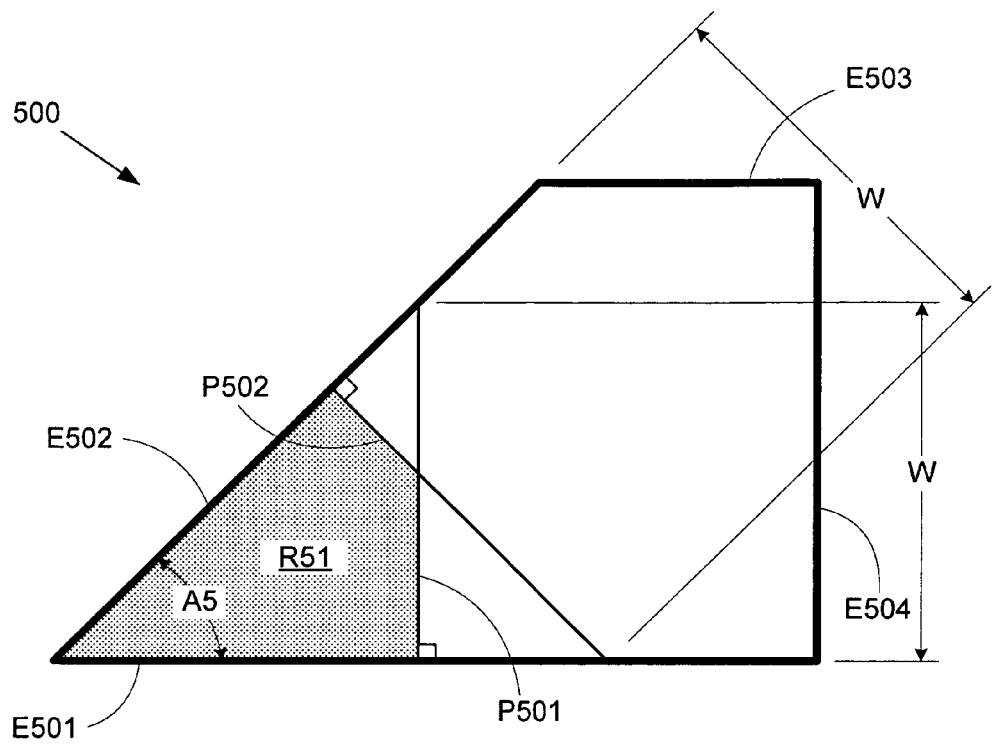
FIGS. 5A and 5B are diagrams of a conventional edge-projection wide metal extraction technique.

Unlike conventional projected edge methods (such as described with respect to FIG. 5A, projected edges P601 and P602 are not the same length as threshold width W. Instead, both projected edges P601 and P602 are equal to a length X (edges P601 and P602 have the same length because projected edges P601 and P602 are both tangent to detection circle C610 and are perpendicular to edges E601 and E602, respectively, and because both edges E601 and E602 are also tangent to detection circle C610). Length X is the projection distance between edges E601 and E602 and represents the minimum edge-to-edge distance for wide geometries extracted using circle-tangent-based projected edges (P601 and P602).

Note that length X can range from threshold width W (for parallel edges) to half of threshold width W (at right angle edges). Thus, the maximum deviation of length X from threshold width W (and hence the maximum deviation from optimal wide element detection) is at edges that have a right angle relationship. Therefore, according to various embodiments of the invention, wide elements can be defined to include some acute angles (e.g., 80° and higher), so that acute angles close to 90° are not trimmed, thereby simplifying the wide element extraction process.

Length X can be calculated by constructing a radial line R1 from the center of detection circle C610 to the tangent between projected edge P601 and detection circle C610, and by constructing a radial line R2 from the center of detection circuit C610 to the intersection of projected edge P601 and edge E602. Length X of projected edge P601 can then be calculated from the following:

$$X = \tfrac{1}{2}W + \tfrac{1}{2}W^{*}\tan(B6) \qquad [\text{EQ. 1}]$$

where B6 is the angle between radial lines R1 and R2. Next, constructing another radial line R3 from the center of detection circle C610 to the point of tangency between edge E602 and detection circle C610 generates a mirror of the triangle formed by edge E602 and radial lines R1 and R2. Therefore, the sum of angles formed along edge E602 at the intersection of edge 602 and projected edge P601 is given by:

$$180° = (90° - A6) + 2^{*}(90° - B6) \qquad [\text{EQ. 2}]$$

which can then be solved for angle B6 by the following:

$$B6 = 45° - \tfrac{1}{2}A6 \qquad [\text{EQ. 3}]$$

Substituting Equation 3 into Equation 1 then yields:

$$X = \tfrac{1}{2}W + \tfrac{1}{2}W^{*}\tan(45° - \tfrac{1}{2}A6) \qquad [\text{EQ. 4}]$$

which resolves to the following:

$$X = \tfrac{1}{2}W^{*}(1 + \tan(45° - \tfrac{1}{2}A6)) \qquad [\text{EQ. 5}]$$

Then, using the trigonometric identity for a tangent of a difference, Equation 5 can be rewritten as the following:

$$X = 1/2W * \left[1 + \left(\frac{\tan(45°) - \tan(1/2A6)}{1 + \tan(45°) * \tan(1/2A6)}\right)\right] \qquad [\text{Eq. 6}]$$

Since the tangent of a 45° angle is equal to one, Equation 6 resolves to the following:

$$X = 1/2W * \left[1 + \left(\frac{1 - \tan(1/2A6)}{1 + \tan(1/2A6)}\right)\right] \qquad [\text{Eq. 7}]$$

which finally resolves to the following:

$$X = W/(1 - \tan(\tfrac{1}{2}A6)) \qquad [\text{EQ. 8}]$$

In this manner, length X can be expressed as a function the threshold width W and the angle (A6) between edges E601 and E602. Note that Equation 8 allows projected edges P601 and P602 to be generated without the use of detection circle C610.

Figure 6B:
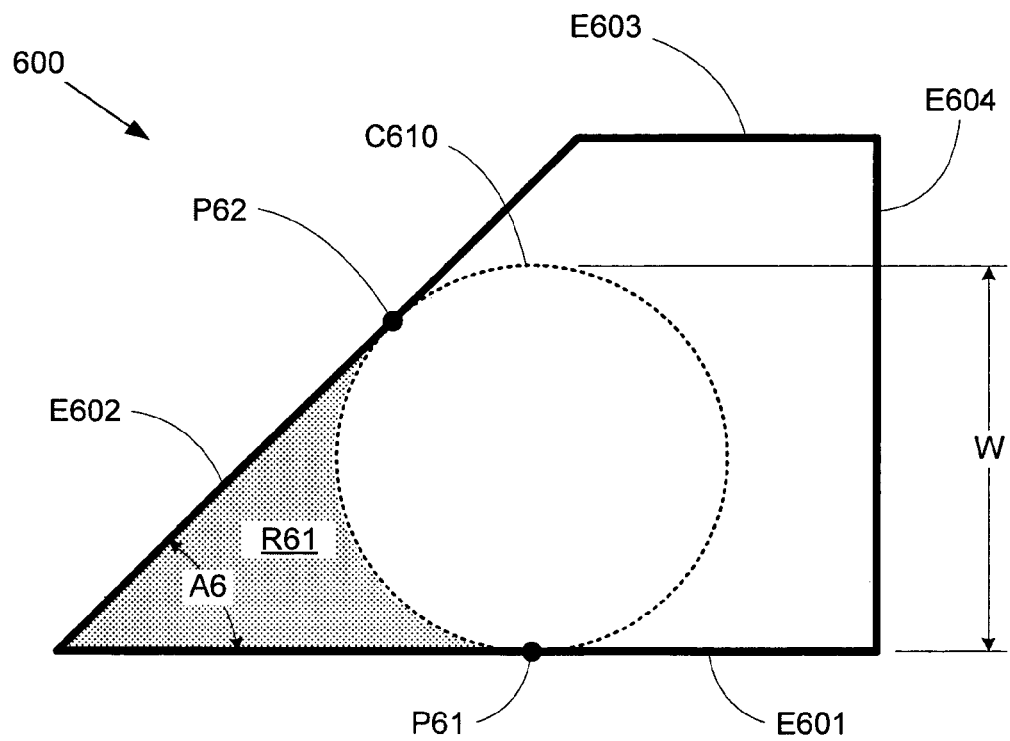
Figure 6C:
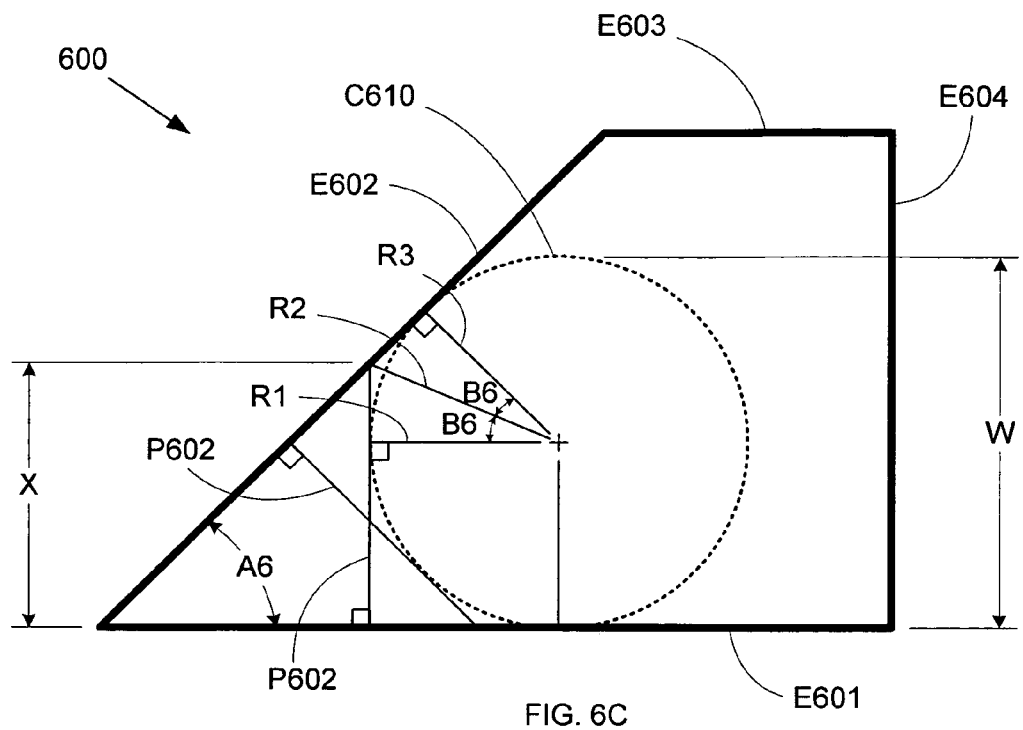
Figure 6D:
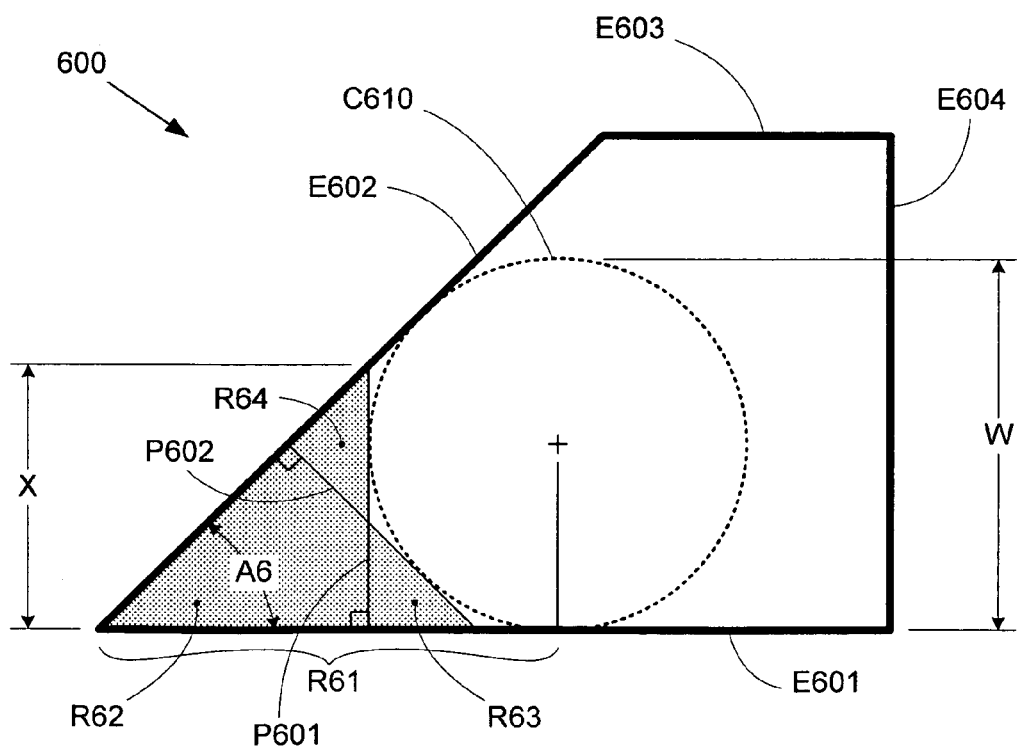

The intersection of projected edges P601 and P602 bounded by edges E601 and E602 defines regions R62, R63, and R64 within non-wide region R61, as shown in FIG. 6D. The boundary of region R62 is formed by edges E601 (the portion of edge E601 originating from the intersection of edges E601 and P601 and directed towards edge E602), E602 (the portion of edge E602 originating from the intersection of edges E602 and P602 and directed towards edge E601), P601 (between edges E601 and P602), and P602 (between edges E602 and P601). The boundary of region R63 is formed by edges E601 (between edges P601 and P602), P601 (between edges E601 and P602), and P602 (between edges E601 and P601). Finally, the boundary of region R64 is formed by edges E602 (between edges P601 and P602), P601 (between edges E602 and P602), and P602 (between edges E602 and P601). The wide geometry extraction process can be performed by specifying some combination of regions R62, R63, and R64 as the trim region and removing that region from polygon 600.

Figure 6E:
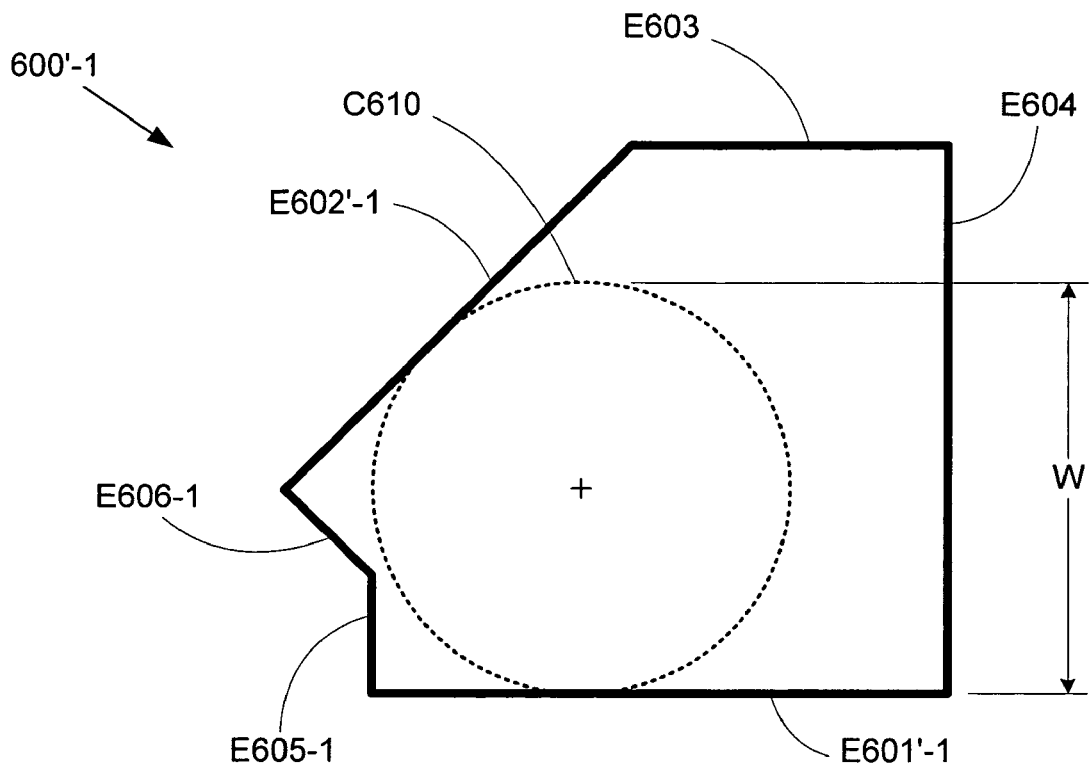

For example, in one embodiment, the trim region is defined as just region R62, resulting in a modified polygon 600'-1, as shown in FIG. 6E. Polygon 600'-1 is formed from edges E601'-1, E605-1, E606-1, E602'-1, E603, and E604. The "birds beak" profile provided by edges E605-1 and E606-1 provides the most conservative representation of wide portions of the original polygon 600 (minimum edge spacing equal to length X).

Figure 6F:
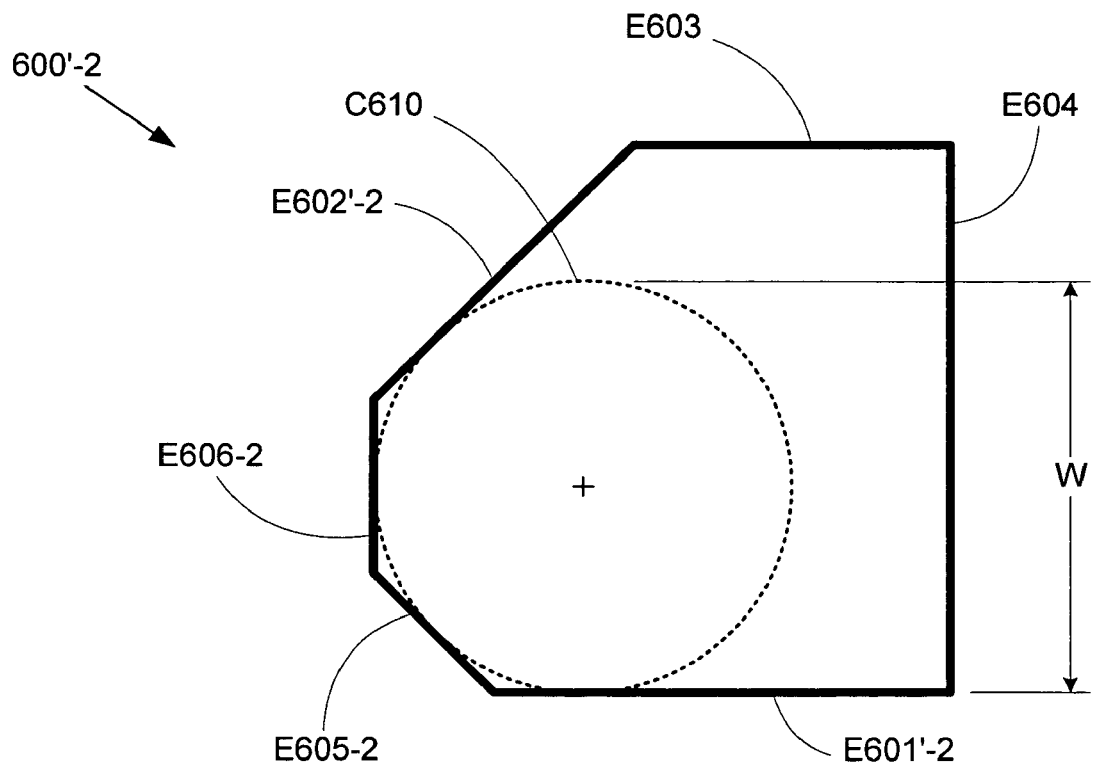

In another embodiment, the trim region can include regions R62, R63, and R64, which results in a modified polygon 600'-2, as shown in FIG. 6F. Polygon 600'-2 is formed from edges E601'-2, E605-2, E606-2, E602'-2, E603, and E604. Edges E605-2 and E606-2 provide a close fit to detection circle C610 while still maintaining a rectilinear polygon profile (i.e., no curved edges). Various other trim region geometries that exhibit tangency to detection circle C610 will be readily apparent. By removing non-wide portions of the physical layout in this manner, a "wide element" layout can be extracted from the physical layout.

Figure 5B:
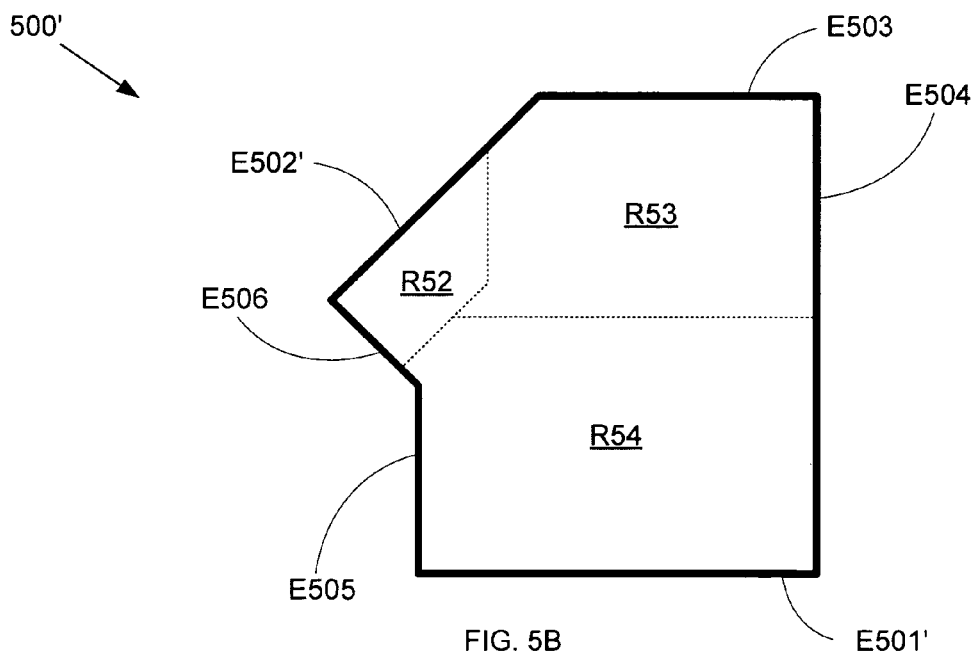

Note that in all instances, because the coverage of detection circle C610 is rotation-independent, detection circle C610 will always "fit" within the new edges formed by the trimming process. Therefore, the use of detection circle C610 can avoid the avalanching problem associated with conventional edge-projection techniques, such as described with respect to FIGS. 5A and 5B.

Figure 7A:
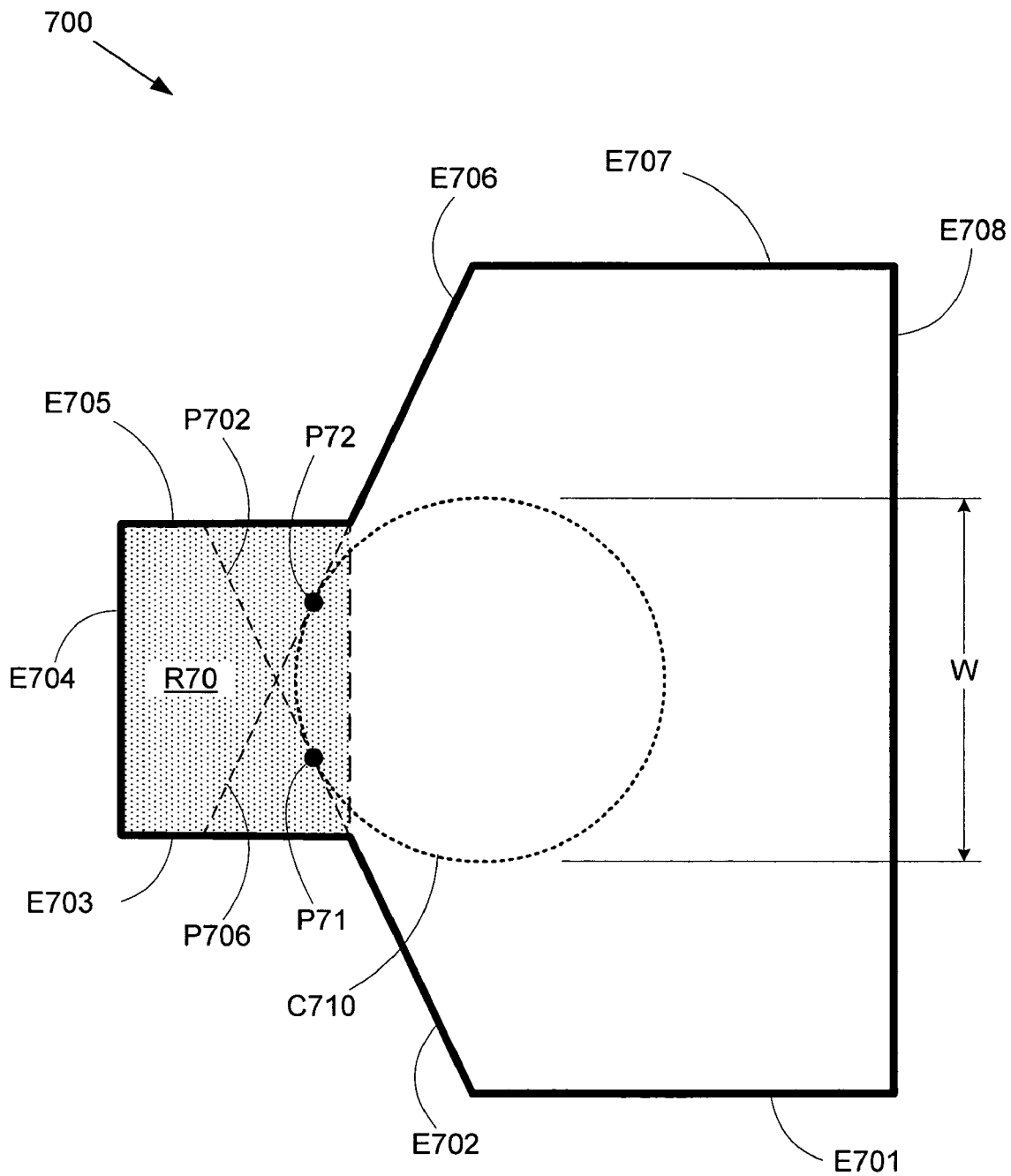
FIGS. 7A-7D are diagrams of a wide element extraction technique based on another circle-tangent trim region methodology.

Note further that edges in addition to those that determine the projection region may also be used to define the trim region. For example, FIG. 7A shows an exemplary polygon 700 formed by edges E701, E702, E703, E704, E705, E706, E707, and E708. Edges E703 and E704 are parallel, and therefore define a rectangular projection region R70. Just as described with respect to FIG. 6A, a detection circle C710 is defined having a diameter equal to a threshold width W. Detection circle C710 is used to define a trim region (described in greater detail below) of projection region R70.

However, because detection circle C710 does not "fit" between edges E703 and E705, tangency cannot be established with those edges. Therefore, to position detection circle C710, tangency is established with adjacent edges E702 and E706 (adjacent to (i.e., share endpoints with) edges E703 and E705, respectively). Specifically, edges E702 and E706 are extended into projection region R70 as projection edges P702 and P706, respectively. Note that in the limit case where adjacent edges E702 and E706 are perpendicular to edges E703 and E705, respectively, projected edges P702 and P706 would still be considered to be extending "into" projection region R70. Detection circle C710 can then be positioned tangent to projected edges P702 and P706 (at points P71 and P72, respectively). Note that while edges E702-E706 are arranged such that detection circle C710 is tangent to projected edges P702 and P706 for exemplary purposes, the sizing and positioning of edges E702-E706 could be such that detection circle C710 is tangent to edges E702 and E706. Alternatively, detection circle C710 could exhibit tangency to edges even further removed from the edges that define the projection region (i.e., non-adjacent edges).

Figure 7B:
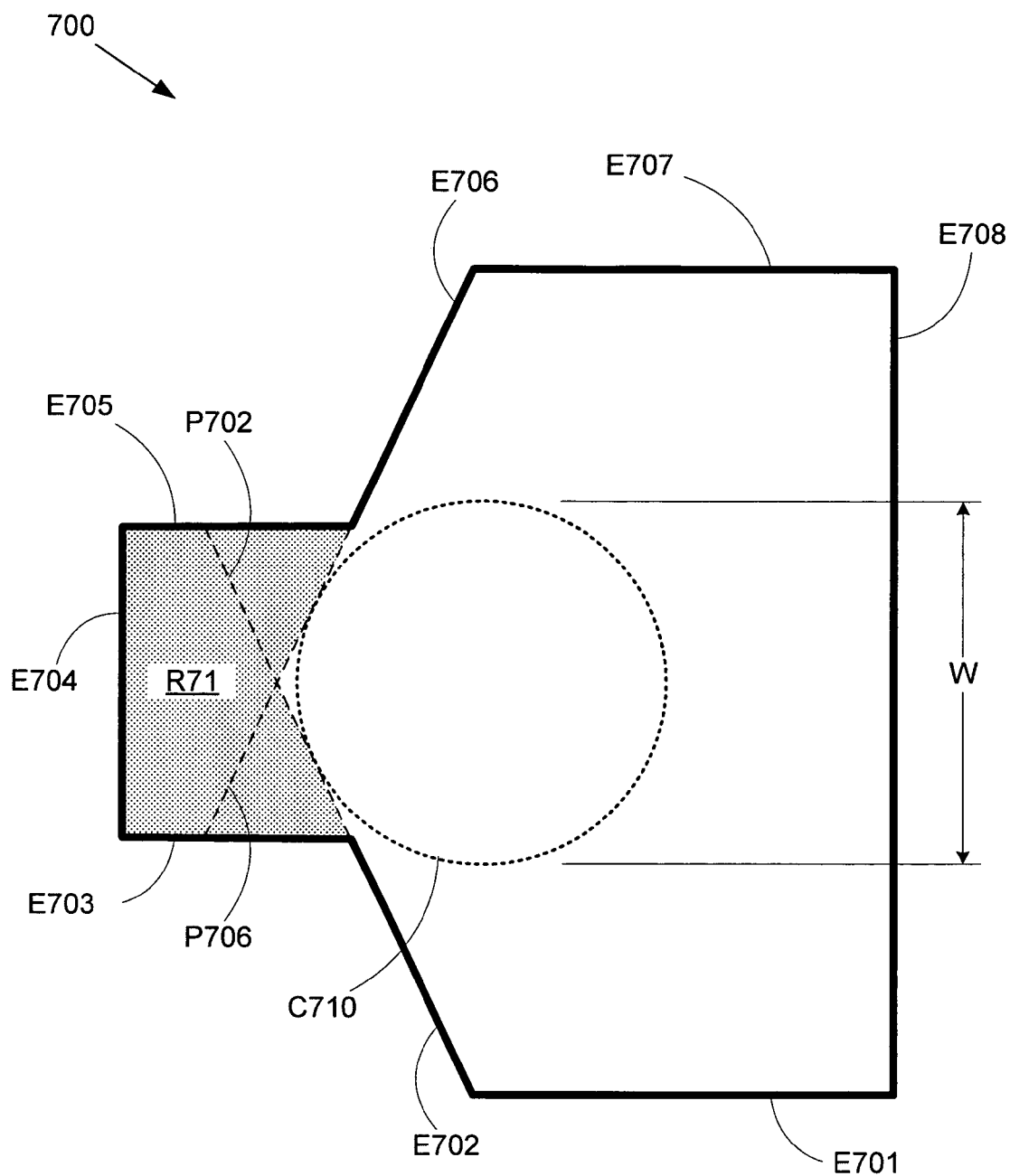
Figure 7C:
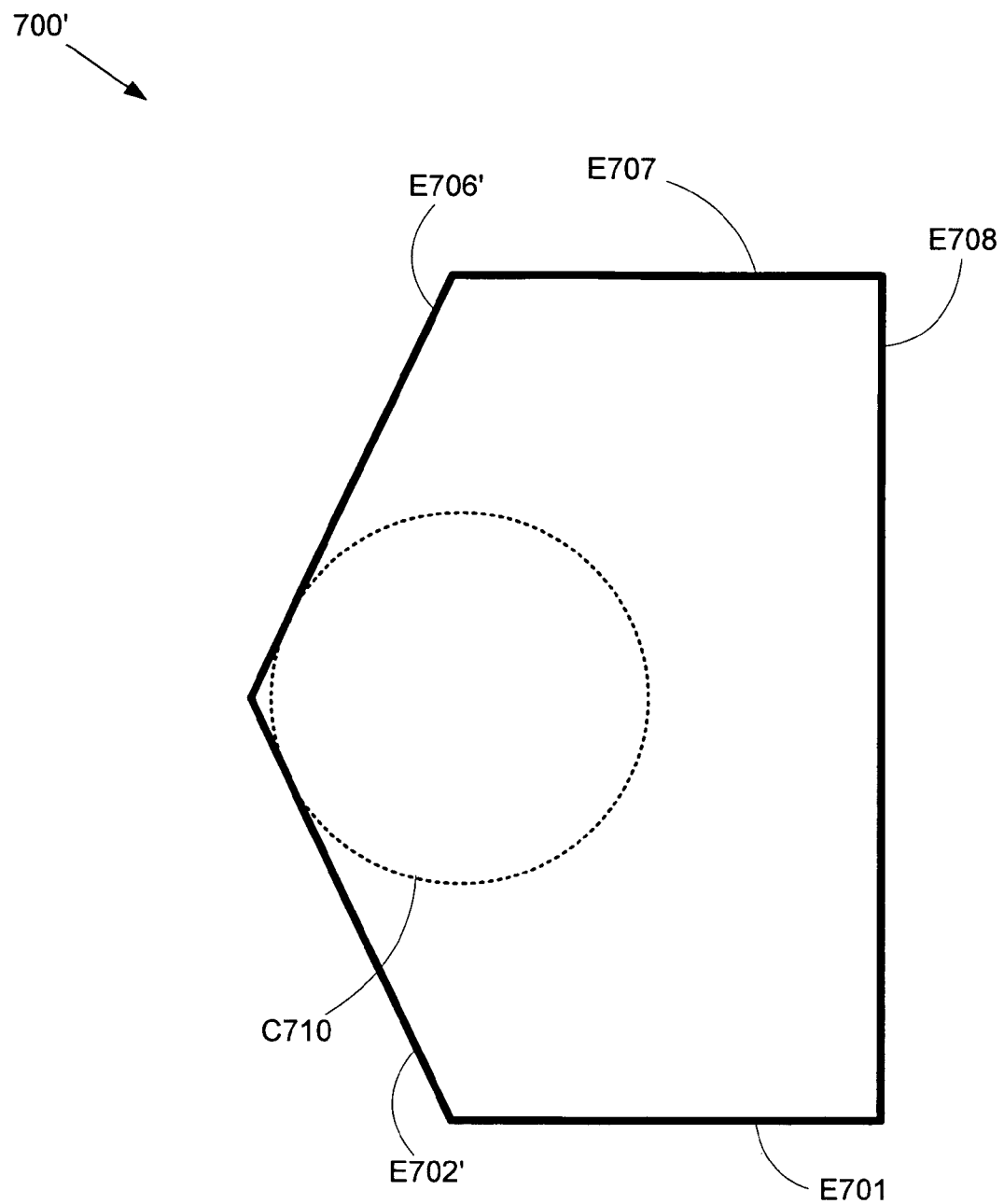

A trim region R71 from projection region R70 can then be defined using projection edges P702 and P706, as shown in FIG. 7B. Trim region R71 can then be removed from polygon 700 to generate a modified polygon 700', as shown in FIG. 7C. Polygon 700' is formed from edges E701, E702', E706', E707, and E708. Note that modified edges E702' and E706' formed by lengthening original edges E702 and E706, respectively, rather than by cutting edges (such as described with respect to edges E601'-2 and E602'-2 shown in FIG. 6F).

Figure 7D:
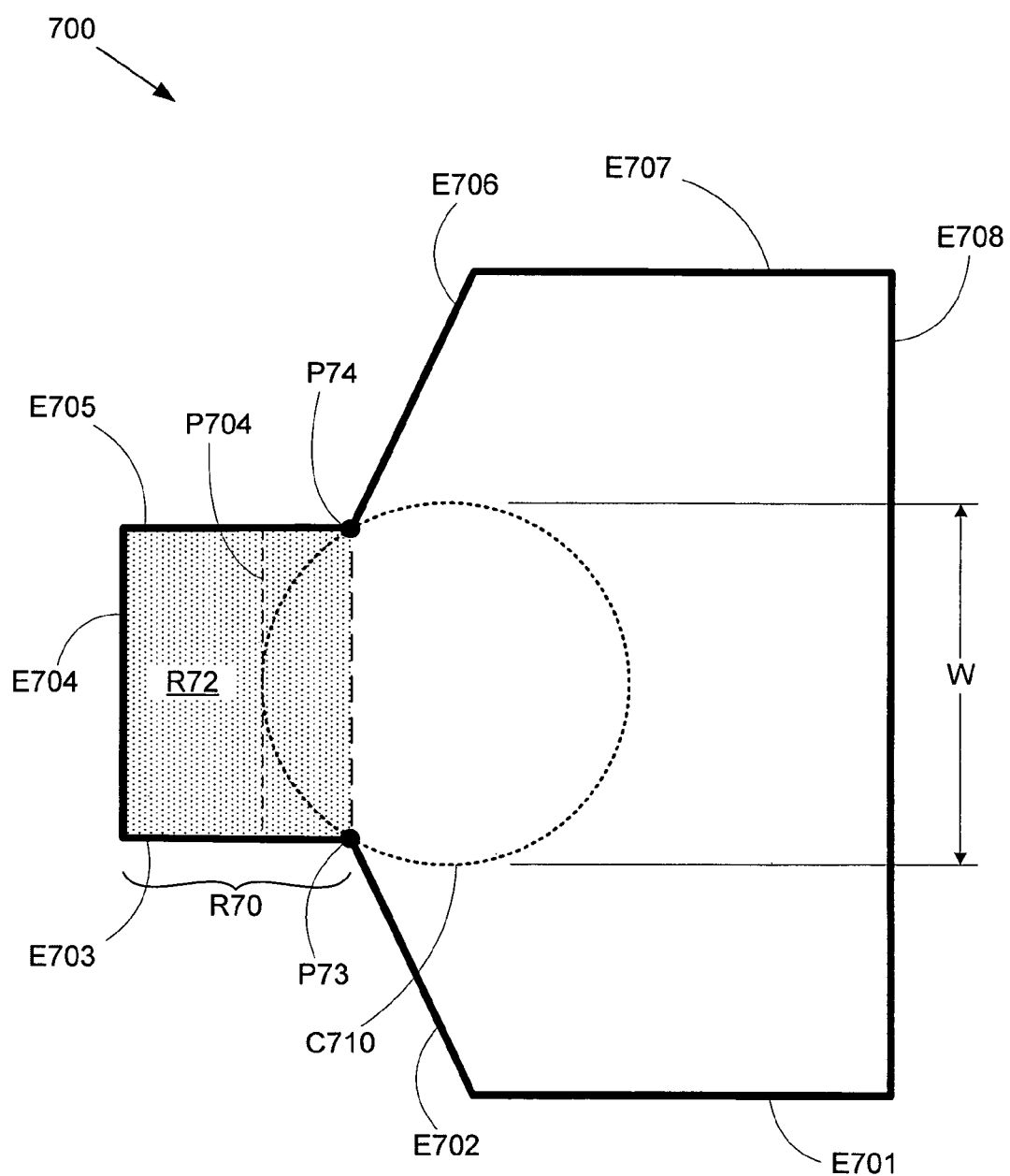

Note further that various other trim regions could be defined that exhibit tangency with detection circle C710. For example, FIG. 7D depicts a rectangular trim region R72 defined within projection region R70 of polygon 700. Trim region R72 is defined by creating a projection edge tangent to detection circle C710 and perpendicular to both edges E703 and E705. Note that for exemplary purposes, detection circle C710 is positioned to intersect the endpoints P73 and P74 of edges E703 and E705, respectively. Therefore, while edge P704 of trim region R72 exhibits tangency with detection circle C710, none of edges E702-E706 exhibit tangency with detection circle C710. However, according to various other embodiments of the invention, projected edge P704 could be generated using a detection circle exhibiting tangency to either or both of edges E702 and E706 (e.g., as shown in FIG. 7A). Various other trim region geometries will be readily apparent.

Figure 1:
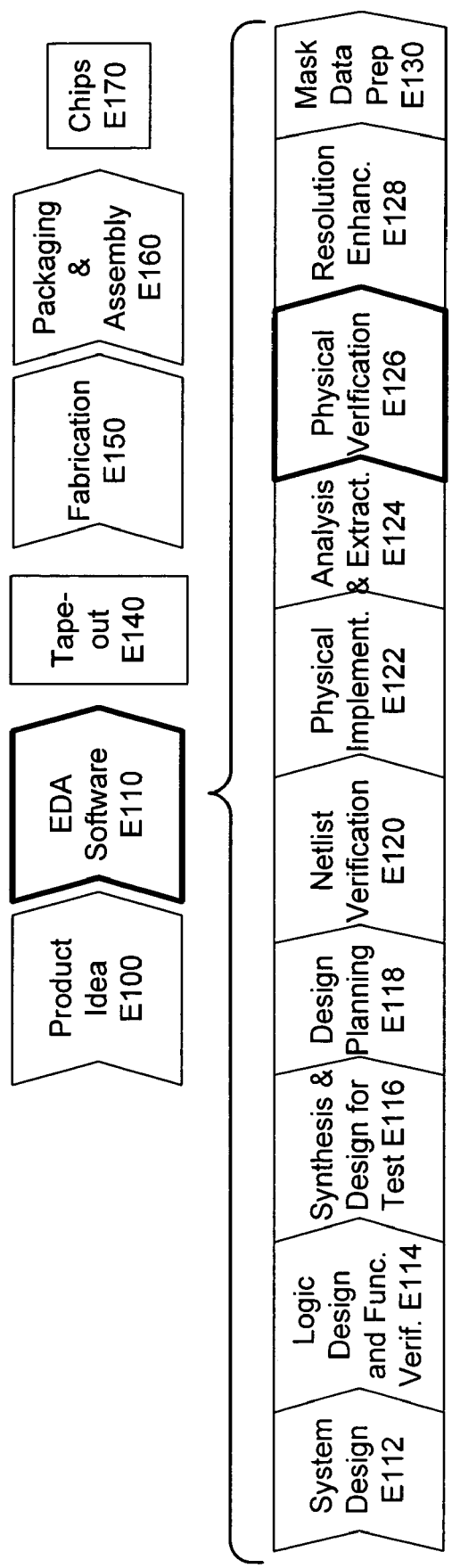
FIG. 1 is a process flow diagram for a general EDA design flow.
Figure 2:
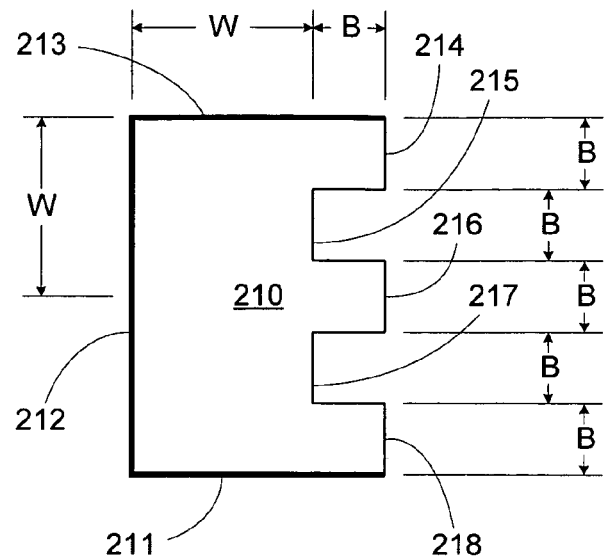
FIG. 2 is a diagram of a conventional wide edge detection technique.
Figure 3A:
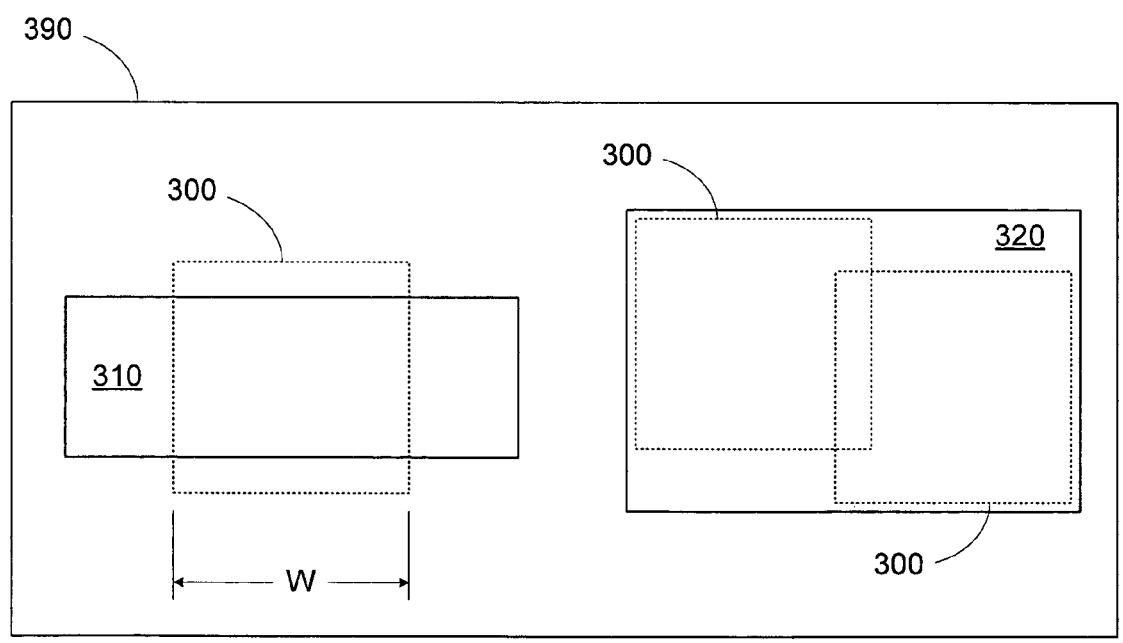
FIGS. 3A and 3B are diagrams of a conventional square containment wide metal extraction technique.
Figure 3B:
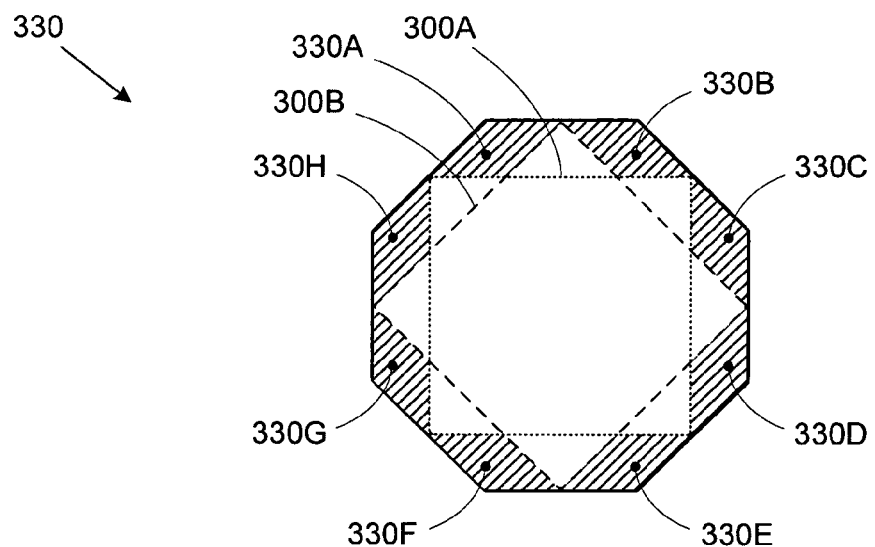
Figure 4A:
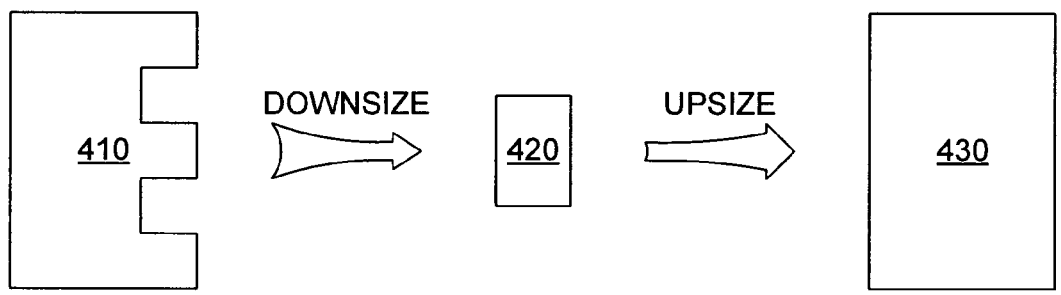
FIGS. 4A and 4B are diagrams of a conventional downsize/upsize wide metal extraction technique.
Figure 4B:
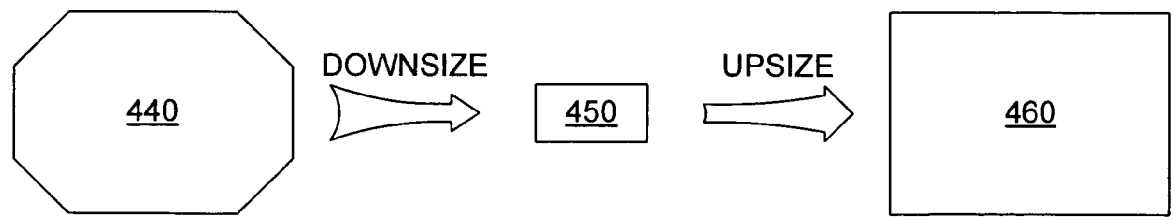
Figure 8:
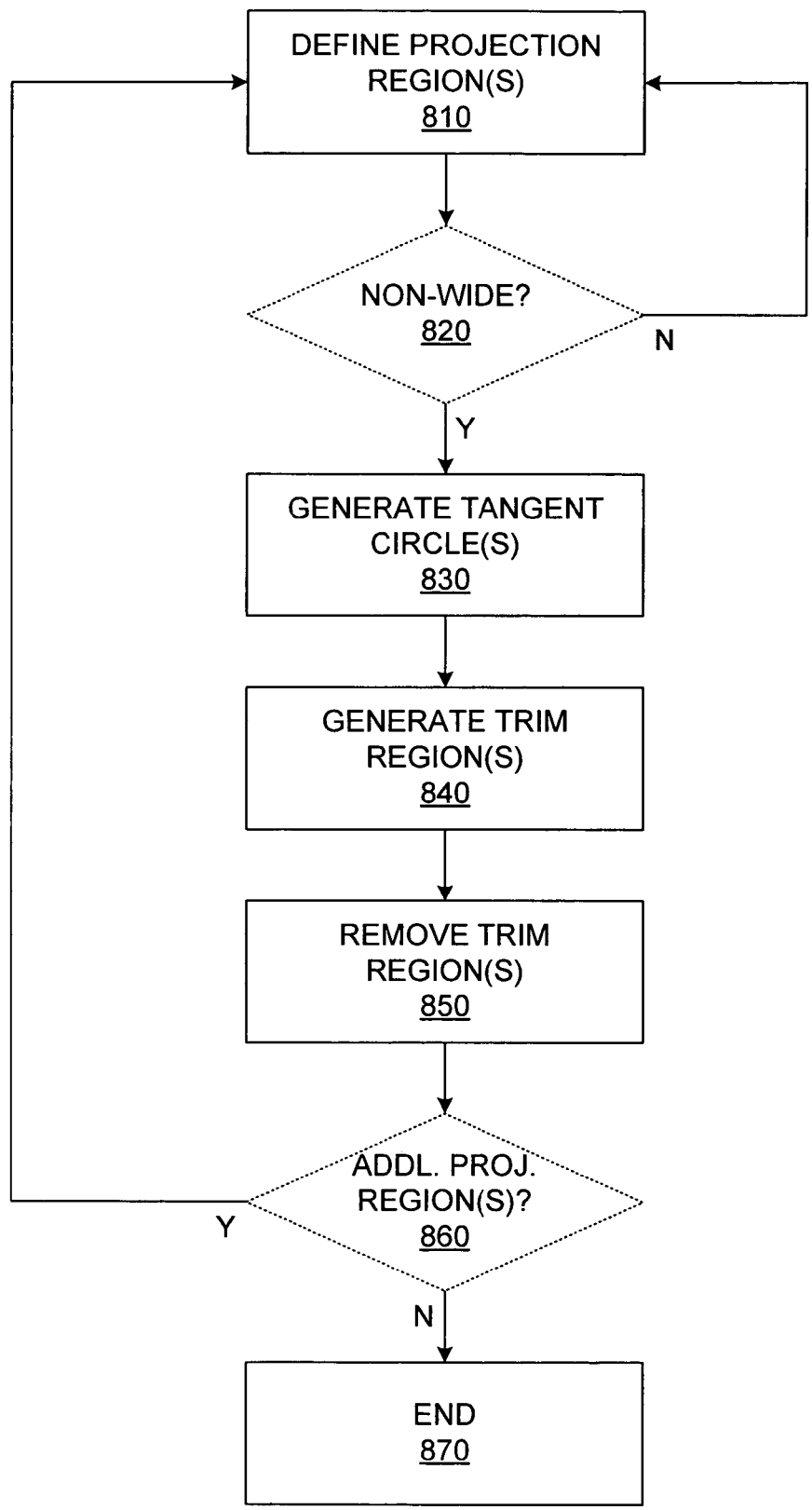
FIG. 8 is a flow diagram of a wide element extraction technique incorporating circle-tangent based trimming.

FIG. 8 shows a flow diagram of an embodiment of a wide element extraction process using circle-tangent detection and trimming, as described with respect to FIGS. 6A-6F and 7A-7C. In a "DEFINE PROJECTION REGION(S)" step 810, one or more projection regions (e.g., projection region R60 in FIG. 6A or projection region R70 in FIG. 7A) from an IC physical layout are selected. Note that the layout may already have undergone initial processing (pre-processing) by non-circle-tangent methods. For example, an original physical layout may first be processed using a conventional wide geometry extraction methodology (such as the edge detection, square containment, and downsizing/upsizing techniques described with respect to FIGS. 2, 3A, and 4A, respectively), before application of the circle-tangent methodology of FIG. 8.

Note further that any type of selection methodology can be used to select the projection regions. For example, in one embodiment, a bounding box having predetermined dimensions can be positioned around a portion of the physical layout. The projection distances between any pairs of edges in the physical layout selected by the bounding box (i.e., edges that fall at least partially within the bounding box) are determined. Those edge pairs that exhibit minimum projection distances less than the threshold width are flagged as being non-wide for subsequent circle-tangent trimming. Alternatively, a particular polygon can be selected, and each pair of edges forming the polygon can be examined individually. In another embodiment, all the projections regions in a polygon can be determined at once, and circle-tangent detection and trimming can be applied simultaneously (as needed). Various other methods will be readily apparent.

If a selected projection regions(s) does not exhibit any non-wide portions, an optional "NON-WIDE?" step 820 can loop the process back to step 810 for the selection of a new projection region(s). Otherwise, the process continues on to a "GENERATE TANGENT CIRCLE(S)" step 830, in which a detection circle(s) (e.g., circles C610 and C710 in FIGS. 6A and 7A, respectively) having a diameter equal to a predetermined threshold width (e.g., width W) is generated.

Then, in a "GENERATE TRIM REGION(S)" step 840, a trim region (e.g., trim regions R62 and R71 in FIGS. 6D and 7B, respectively) are defined, with a portion of the trim region boundary being defined by the edges used to generate the projection region, and a portion of the trim region boundary exhibiting tangency to the detection circle. Note that the portion(s) of the trim region exhibiting tangency to the detection circle can either directly tangent to the detection circle (e.g., projection edges P702 and P706 shown in FIG. 7B) or can be collinear with a line tangent to the detection circle (e.g., the portions of projection edges P601 and P602 bounding region R62 in FIG. 6D).

The trim region(s) defines a non-wide region(s) that can subsequently be removed from the physical layout in a "REMOVE TRIM REGION(S)" step 850. If any further projection regions remain for wide element extraction, an "ADDITIONAL PROJECTION REGION(S)?" step 860 loops the process back to step 810. Otherwise, the wide element extraction process is completed in an "END" step 870.

Figure 9:
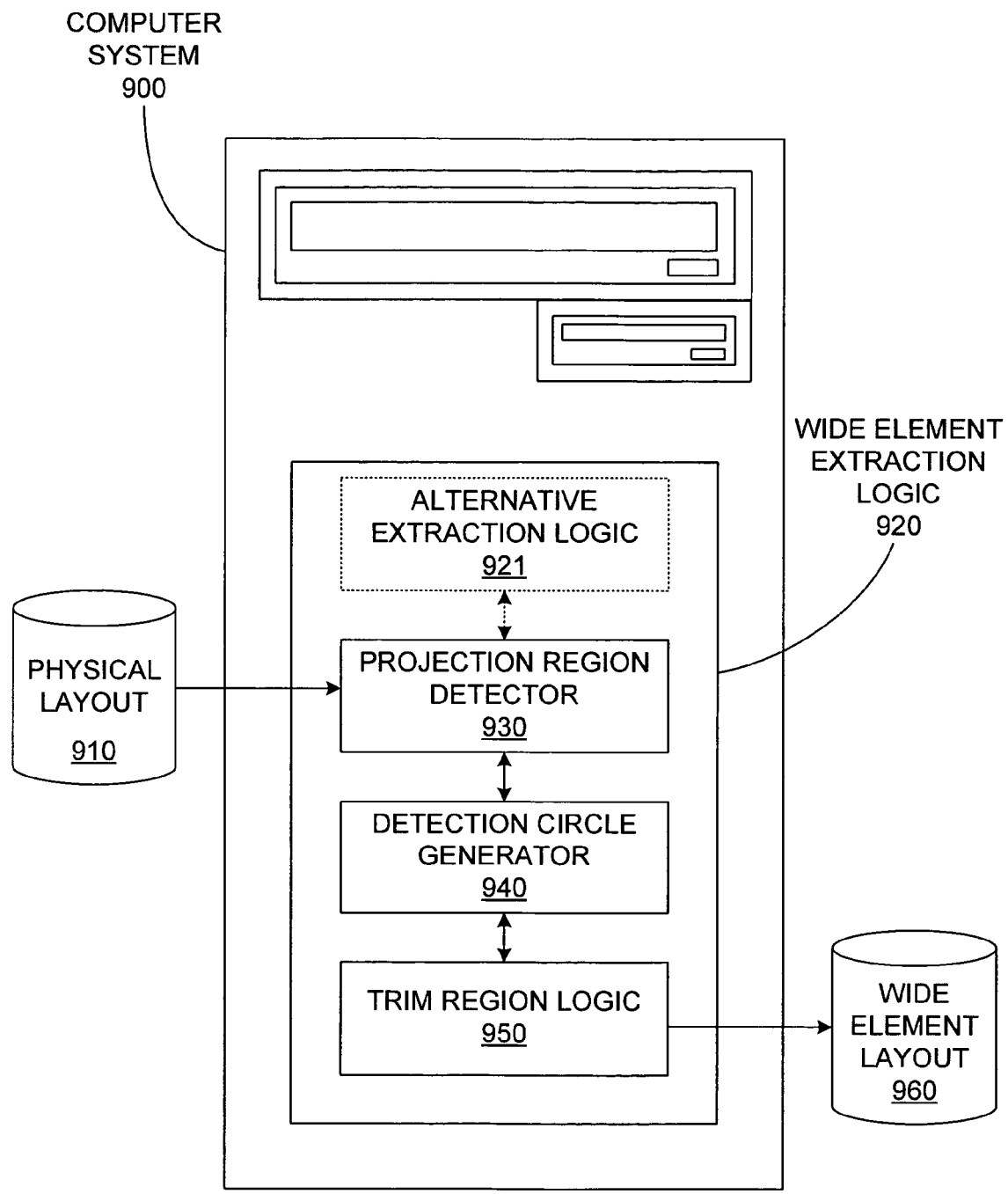
FIG. 9 is a block diagram of a computer system for generating a wide element layout from a physical layout using a circle-tangent trim region methodology.

FIG. 9 shows a block diagram of a computer system 900 that includes wide element extraction logic 920 for applying a circle-tangent methodology as described with respect to FIGS. 6A-6F, 7A-7C, and 8. Wide element extraction logic 920 includes a projection region detector 930, a detection circle generator 940, and trim region logic 950. Projection region detector 930 is configured to receive a physical layout 910, and from that physical layout, select projection regions, as described with respect to steps 810 and 820 in FIG. 8. Note that as described with respect to FIG. 8, physical layout 910 can be an original IC physical layout (i.e., no wide geometry extraction pre-processing) or can be a pre-processed layout to which one or more prior wide element extraction methods have been applied. Note further that in one embodiment, wide element extraction logic 920 can include optional alternative extraction logic 921 (shown using a dotted line) for applying non-circle-tangent-based wide geometry extraction methods before, during, or after operation of projection region detector 930, detection circle generator 940, and trim region logic 950.

Detection circle generator 940 includes logic for creating a circle of a predetermined diameter (e.g., threshold width W), as described with respect to FIGS. 6B and 7A, and with respect to step 830 in FIG. 8. Trim region logic 950 includes instructions for defining and removing trim regions from the projection regions provided by projection region detector 930, with the trim regions exhibiting tangency to the detection circles generated by detection circle generator 940 from the projection regions detected by projection region, as described with respect to FIGS. 6C-6F and 7B-7C, and steps 840 and 850 of FIG. 8. In this manner, non-wide regions can be removed from physical layout 910 by wide element extraction logic 920 to generate a wide element layout 960.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for extracting wide elements from a physical layout, the method comprising:
   selecting a projection region between a first edge and a second edge from the physical layout, the projection region comprising a normal projection of the first edge onto the second edge and a normal projection of the second edge onto the first edge;
   generating a detection circle having a diameter equal to a threshold width;
   defining a trim region in the projection region, a portion of a boundary of the trim region exhibiting tangency with the detection circle; and
   removing the trim region from the physical layout, thereby allowing proper handling of a resulting wide element by an EDA tool.

2. The method of claim 1, wherein generating the detection circle comprises positioning the detection circle tangent to the first edge and the second edge at a first tangent point and a second tangent point, respectively, and wherein the boundary of the trim region comprises:
   a first segment of the detection circle between the first tangent point and the second point;
   a first portion of the first edge originating from the first tangent point; and
   a first portion of the second edge originating from the second tangent point, the first portion of the first edge and the first portion of the second edge converging away from the detection circle.

3. The method of claim 1, wherein the first edge and the second edge intersect.

4. The method of claim 1, wherein the first edge and the second edge are joined by one or more contiguous edges.

5. The method of claim 1, wherein generating the detection circle comprises positioning the detection circle tangent to the first edge and the second edge at a first tangent point and a second tangent point, respectively, and
   wherein defining the trim region comprises:
      creating a first projected edge between the first edge and the second edge, the first projected edge being perpendicular to the first edge at a first point and tangent to the detection circle; and
      creating a second projected edge between the first edge and the second edge, the second projected edge being perpendicular to the second edge at a second point and tangent to the detection circle, wherein the boundary of the trim region comprises:
         a portion of the first edge originating from the first point and directed towards the second edge;
         a portion of the second edge originating from the second point and directed towards first edge;
         the first projected edge between the first point and the second projected edge; and
         the second projected edge between the second point and the first projected edge.

6. The method of claim 1, wherein generating the detection circle comprises positioning the detection circle tangent to the first edge and the second edge at a first tangent point and a second tangent point, respectively, and
   wherein defining the trim region comprises:
      creating a first projected edge between the first edge and the second edge, the first projected edge being perpendicular to the first edge at a first point and tangent to the detection circle; and
      creating a second projected edge between the first edge and the second edge, the second projected edge being perpendicular to the second edge at a second point and tangent to the detection circle, wherein the boundary of the trim region comprises:
         a portion of the first edge originating from an intersection of the second projected edge and the first edge and directed towards the second edge;
         a portion of the second edge originating from an intersection of the first projected edge and the second edge and directed towards first edge;
         the first projected edge between the second edge and the second projected edge; and
         the second projected edge between the first edge and the first projected edge.

7. The method of claim 1, wherein the first edge and the second edge are part of polygon, and
   wherein generating the detection circle comprises positioning the detection circle tangent to a third edge of the polygon.

8. The method of claim 7, wherein the third edge is adjacent to the first edge.

9. The method of claim 1, wherein the first edge and the second edge are part of a polygon,
   wherein generating the detection circle comprises positioning the detection circle tangent to a first projected edge, the first projected edge being generated by extending a third edge of the polygon into the projection region.

10. The method of claim 1, wherein selecting the projection region comprises:
    specifying a bounding box around a portion of the physical layout, the bounding box having a predetermined height and a predetermined width;
    selecting a pair of edges in the physical layout selected by the bounding box;
    determining a minimum projection distance between the pair of edges;
    compiling a test projection region defined by the pair of edges into a non-wide element set if the minimum projection distance between the pair of edges is less than a threshold width, the threshold width being equal to the predetermined diameter of the detection circle;
    repeating the steps of selecting the pair of edges, determining the minimum projection distance, and compiling the test projection region defined by the pair of edges for all edges in the physical layout selected by the bounding box; and
    selecting the projection region from a first test projection region in the non-wide element set.

11. The method of claim 1, wherein selecting the projection region comprises:
    selecting a polygon from the physical layout;
    selecting a first test edge of the polygon;
    selecting a second test edge of the polygon;
    setting the first test edge and the second test edge as the first edge and the second edge, respectively, if a minimum projection distance between the first test edge and the second test edge is less than the threshold width.

12. A system for extracting a wide element layout from a physical layout, the system comprising:
    selection logic for selecting a first projection region defined by a first pair of edges in the physical layout;
    circle generation logic for generating a detection circle, the detection circle having a diameter equal to a threshold width; and
    trim region logic for defining and removing a trim region from the first projection region and outputting a resulting wide element, a portion of a boundary of the trim region exhibiting tangency with the detection circle.

13. The system of claim 12, wherein the selection logic comprises:
   logic for positioning a bounding box having predetermined dimensions around a portion of the physical layout;
   logic for determining a set of edges in the physical layout selected by the bounding box;
   logic for compiling projection regions from each pair of edges in the set of edges having a minimum projection distance less than the threshold width into a set of flagged projection regions; and
   logic for selecting the first projection region from the set of flagged projection regions.

14. The system of claim 12, wherein the first pair of edges includes a first edge and a second edge, wherein the circle generation logic comprises logic for positioning the detection circle tangent to the first edge and the second edge, and wherein the trim region logic comprises:
   logic for generating a first projected edge between the first edge and the second edge, the first projected edge being perpendicular to the first edge at a first point and tangent to the detection circle; and
   logic for generating a second projected edge between the first edge and the second edge, the second projected edge being perpendicular to the second edge at a first point and tangent to the detection circle, wherein a boundary of the trim region comprises:
      a portion of the first edge originating from the first point and directed towards the second edge;
      a portion of the second edge originating from the second point and directed towards the first edge;
      the first projected edge between the first point and the second projected edge; and
      the second projected edge between the second point and the first projected edge.

15. The system of claim 12, wherein the first pair of edges includes a first edge and a second edge, wherein the circle generation logic comprises logic for positioning the detection circle tangent to the first edge and the second edge, and wherein the trim region logic comprises:
   logic for positioning the detection circle tangent to the first edge and the second edge;
   logic for generating a first projected edge between the first edge and the second edge, the first projected edge being perpendicular to the first edge at a first point and tangent to the detection circle; and
   logic for generating a second projected edge between the first edge and the second edge, the second projected edge being perpendicular to the second edge at a first point and tangent to the detection circle, wherein a boundary of the trim region comprises:
      a portion of the first edge originating from an intersection of the first edge and the second projected edge and directed towards the second edge;
      a portion of the second edge originating from an intersection of the second edge and the first projected edge and directed towards the first edge;
      the first projected edge between the second edge and the second projected edge; and
      the second projected edge between the first edge and the first projected edge.

16. The system of claim 12, wherein the first pair of edges includes a first edge and a second edge,
   wherein the first edge and the second edge are part of a polygon, and
   wherein the circle generation logic comprises logic for positioning the detection circle tangent to a third edge of the polygon.

17. The system of claim 16, wherein the third edge is adjacent to the first edge.

18. The system of claim 12, wherein the first pair of edges includes a first edge and a second edge,
   wherein the first edge and the second edge are part of a polygon, and
   wherein the circle generation logic comprises logic for positioning the detection circle tangent to a first projected edge, the first projected edge being generated by extending a third edge of the polygon into the first projection region, the third edge being adjacent to the first edge.

19. A method for extracting wide elements from a physical layout, the method comprising:
   selecting projection region between a first edge and a second edge in the physical layout, wherein a minimum projection distance between the first edge and the second edge is less than or equal to a threshold width W;
   constructing a first projected edge between the first edge and the second edge, the first projected edge being perpendicular to the first edge;
   constructing a second projected edge between the first edge and the second edge, the second projected edge being perpendicular to the second edge, wherein the first projected edge and the second projected edge both have a length X equal given by the formula:

$X = W/(1-\tan(\frac{1}{2}A))$; and trimming away a portion of a non-wide region bounded by the first edge, the second edge, the first projected edge, and the second projected edge, thereby allowing proper handling of a resulting wide element by an EDA tool.

20. The method of claim 19, wherein the portion of the non-wide region comprises a first removal region, a boundary of the first removal region comprising:
   a portion of the first edge originating from an intersection of the first edge and the first projected edge and directed towards the second edge;
   a portion of the second edge originating from an intersection of the second edge and the second projected edge and directed towards the first edge;
   a portion of the first projected edge between the first edge and the second projected edge; and
   a portion of the second projected edge between the second edge and the first projected edge.

21. The method of claim 20, wherein the portion of the non-wide region further comprises:
   a second removal region, a boundary of the second removal region consisting of the first edge between the first projected edge and the second projected edge, the first projected edge between the first edge and the second projected edge, and the second projected edge between the first edge and the first projected edge; and
   a third removal region, a boundary of the third removal region consisting of the second edge between the first projected edge and the second projected edge, the first projected edge between the second edge and the second projected edge, and the second projected edge between the second edge and the first projected edge.

* * * * *